United States Patent [19]
Foley

[11] 4,414,479
[45] Nov. 8, 1983

[54] LOW DISSIPATION SNUBBER FOR SWITCHING POWER TRANSISTORS

[75] Inventor: James W. B. Foley, Peru, Mass.

[73] Assignee: General Electric Company, Salem, Va.

[21] Appl. No.: 283,219

[22] Filed: Jul. 14, 1981

[51] Int. Cl.³ .................... H03K 17/04; H03K 17/60
[52] U.S. Cl. .................................. 307/253; 307/254; 307/315
[58] Field of Search ............... 307/253, 254, 300, 315, 307/263

[56] References Cited
U.S. PATENT DOCUMENTS

| | | | |
|---|---|---|---|
| 3,571,614 | 3/1971 | Rolstead | 307/253 |
| 4,010,387 | 3/1977 | Akamatsu | |
| 4,365,171 | 12/1982 | Archer | 307/253 |

*Primary Examiner*—John Zazworsky
*Attorney, Agent, or Firm*—Ormand R. Austin; Arnold E. Renner

[57] ABSTRACT

A low dissipation snubber for switching power transistors uses the energy stored in a snubber capacitor to provide all the base boost power required for switching the power transistors on. The snubber consists of a diode and a snubber capacitor connected in series between the collector and emitter of the switching transistors with a resistor connected at one end to the junction of the diode and the snubber capacitor. The other end of the resistor is connected to the base turn-on circuit for the switching power transistors so as to provide a discharge path for the snubber capacitor. By using the discharge of the snubber capacitor, power which is normally dissipated as heat is reclaimed so that the drive power requirements for the switching power transistors are reduced.

5 Claims, 10 Drawing Figures

LOW DISSIPATION SNUBBER FOR SWITCHING POWER TRANSISTORS

STATEMENT OF GOVERNMENT INTEREST

The U.S. Government has rights in this invention pursuant to Contract No. N00024-79-C-6276 awarded by the Department of Navy.

BACKGROUND OF THE INVENTION

The subject invention generally relates to circuits employing power switching transistors such as inverters, choppers and the like, and more particularly to improvements in snubber circuits for such power switching transistors.

Figure 1:
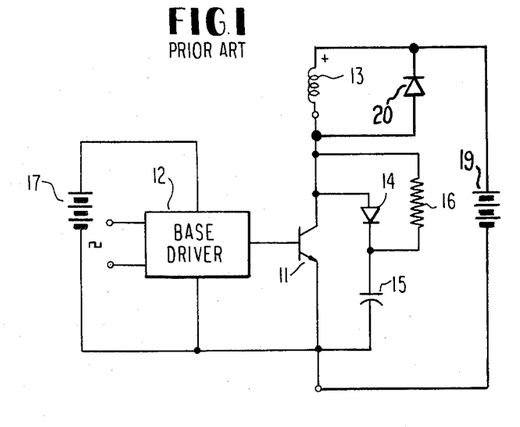
FIG. 1 is a block and schematic diagram of a conventional snubber circuit.

The conventional method for controlling the load line of bipolar transistors is to connect a polarized snubber from the collector to the emitter as shown in FIG. 1. More specifically, (an NPN) transistor 11 is controlled by a base driver circuit 12 to alternately turn on and off so as to permit current to flow or block the flow of current through the load 13, (here represented as an inductor). The snubber circuit consists of a diode 14 and a capacitor 15 connected in series between a collector terminal and an emitter terminal of transistor 11 and a resistor 16 connected between the junction of a diode 14 and a capacitor 15 and the collector terminal of transistor 11. In this arrangement, a base driver power supply 17 (represented as a battery) must provide sufficient voltage to supply the base boost required to turn the transistor 11 on.

The basic purpose of the snubber circuit consisting of the diode 14, the capacitor 15 and the resistor 16 is to protect the transistor 11 at turn-off by transferring the collector current to the capacitor 15 via the diode 14 before the transistor voltage is allowed to rise. This reduces switching power losses in the transistor 11. The snubber capacitor 15 must be discharged prior to any subsequent turn-off of the transistor 11. This discharge is performed by the transistor 11 when it turns on through the resistor 16.

One problem with this snubbing technique is that it increases the switching losses during the period that the switching transistor is turning on, since the snubber presents a capacitive load to the transistor. The transistor must pick up both the load current and the snubber discharge current at turn-on. With a clamped inductive load, it must also pick up the reverse recovery current of a clamping diode 20.

Figure 2:
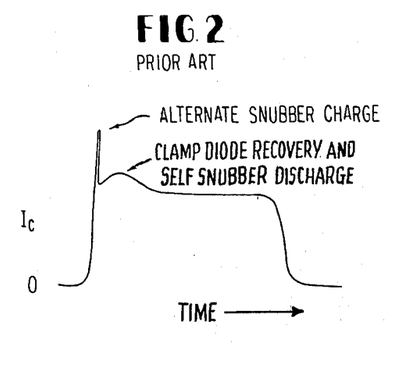
FIG. 2 is a graph of the collector current waveform of the conventional snubber circuit shown in FIG. 1.

A collector current waveform typically occurring in a push-pull circuit is illustrated in FIG. 2. The high peak collector current at turn-on requires more base current drive to maintain saturation. The base current drive requirement is further aggravated by the fact that most power transistor current gains ($\beta$) drop off significantly at high collector current values. The peaking of the base drive current necessary to compensate for the low gain at high collector current is usually provided by a parallel RC circuit in series with the base terminal.

SUMMARY OF THE INVENTION

It is therefore an object of the present invention to provide an improved snubber circuit for switching power transistors.

It is another object of the invention to provide an improved snubber circuit for switching power transistors which provides faster rise time of base drive current.

It is a further object of the invention to improve the efficiency of switching power transistor snubber circuits by reclaiming some of the normally dissipated power in order to reduce the base driver power supply requirements.

It is a still further object of the invention to improve the efficiency of a push-pull transistor power switching circuit by disconnecting the snubber circuit on alternate half-cycles.

The foregoing and other objects of the invention are achieved by a modification of the conventional snubber circuitry so that the snubber capacitor is discharged through the base turn-on circuit rather than through the collector of the power switching transistors. Since the invention uses the energy stored in the snubber capacitor to provide the additional power required for the base drive circuitry, the base current boost compensates for the increased collector current which causes the fall off of current gain at the moment of turn-on. All of the base boost power is derived from the snubber energy, which is usually dissipated as heat, thereby increasing the overall system efficiency. The effective snubber power source is combined with the base turn-on power supply, both of which are referenced to the transistor emitter, to provide the base boost power.

The voltage level of the base turn-on power supply is usually dictated by stray inductance in the base circuit and the rise time required to minimize losses at turn-on. This voltage is considerably higher than that required to sustain saturation, and excess power is consumed in the base circuit most of the on-time. In simple drive circuits, the higher drive level stores excess charge in the base causing longer turn-off delays. Using the power feedback technique according to the invention, a high voltage source (the snubber charge) is available to supply all of the energy required for turning on the transistor. The voltage level of the base turn-on supply can be reduced to a level just great enough to sustain the base drive level after the transistor saturates.

BRIEF DESCRIPTION OF THE DRAWINGS

The specific nature of the invention, as well as other objects, aspects, uses and advantages thereof, will clearly appear from the following description and from the accompanying drawings, in which.

DETAILED DESCRIPTION OF THE INVENTION

Figure 3:
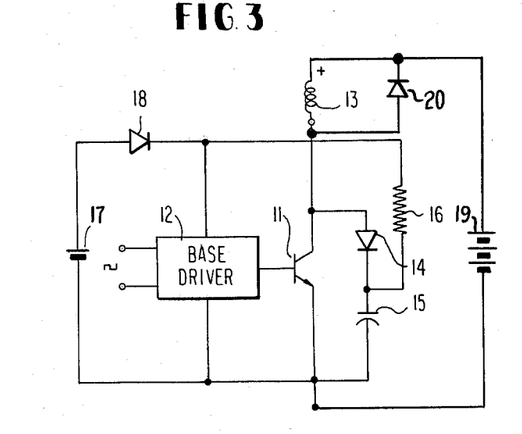
FIG. 3 is a block and schematic diagram of the improved snubber circuit according to the present invention.
Figure 4:
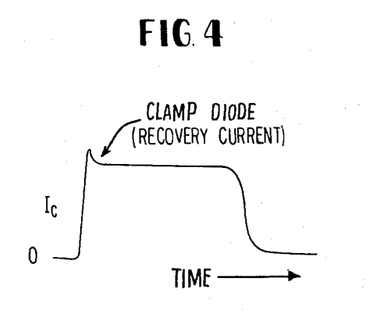
FIG. 4 is a graph of the collector current waveform of the new snubber circuit shown in FIG. 3.

Reference is now made to FIG. 3 of the drawings wherein like reference numerals represent the same or similar elements as shown in the conventional snubber circuit of FIG. 1. More specifically, the resistor 16 is now connected between the junction of diode 14 and capacitor 15 and the base driver 12. Discharge of the snubber capacitor 15 is now through the base driver 12 instead of the collector to emitter path of transistor 11. A diode 18 is inserted between the power supply 17 and the base driver 12 to isolate the power supply 17 from the high voltage discharge of snubber capacitor 15. Since all of the base boost is now supplied by the discharge of snubber capacitor 15, the power supply 17 can be substantially smaller than the power supply 17 used in the conventional circuit shown in FIG. 1. The resulting collector current waveform is shown in FIG. 4. It will be observed that the peak collector current, $I_c$, at turn-on is reduced requiring less base drive current peaking to keep the transistor 11 in saturation at turn-on.

Figure 9:
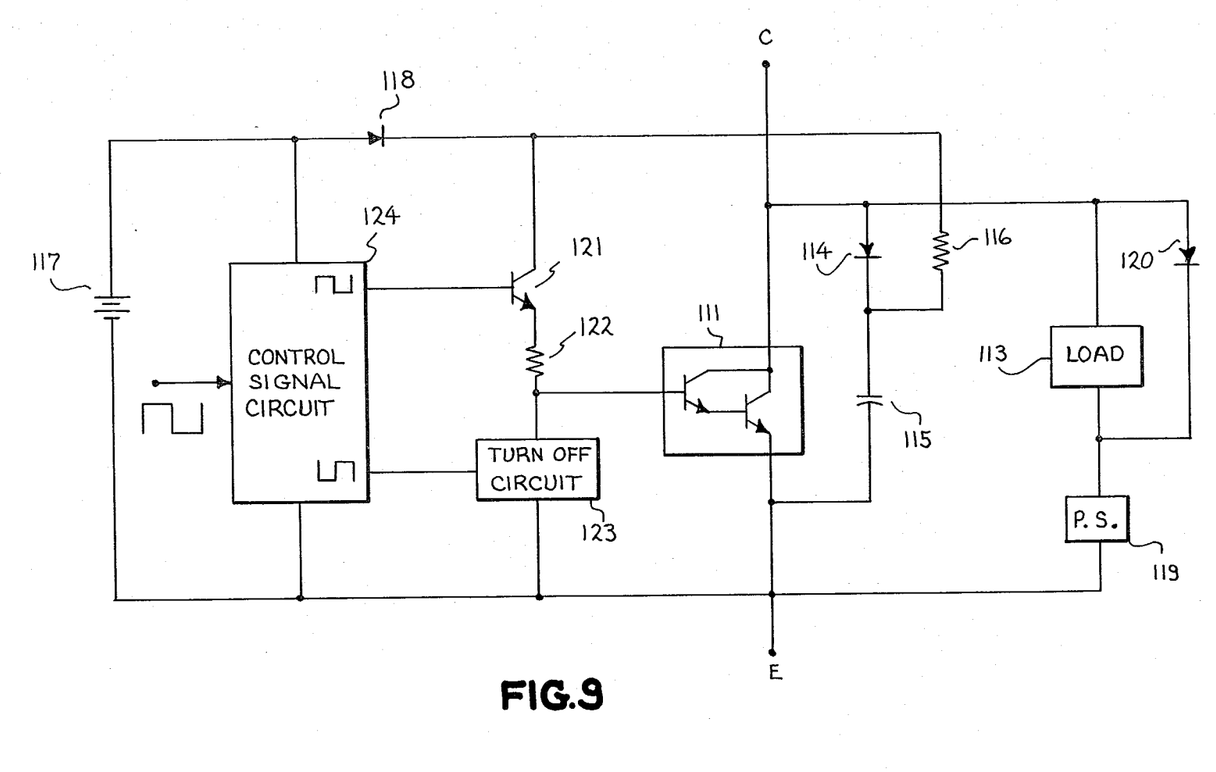

Referring momentarily to FIG. 9, there is shown a partial block diagram, partial schematic of a specific embodiment of the invention. The switching power transistor 111 is represented as a Darlington pair which, depending on the specific application, may comprise any number of transistors connected to form a switch. The snubber circuit consists of diode 114 and capacitor 115 connected between the collector and emitter terminals of transistor 111 and resistor 116 connected at one end to the junction of capacitor 115 and diode 114 and at the other end to the junction of a base driver and turn-on switch transistor 121 and an isolation diode 118.

The transistor 121 provides the base current drive to transistor 111 through a current limiting resistor 122. The transistor 121 is depicted as an NPN bipolar transistor but, depending on the specific application, can be any number or type of device connected to form a single pole switch. A turn-off circuit 123 is provided to turn off and hold off the power switching transistor 111. A control signal circuit 124 is required to provide the appropriate signals to operate the turn-on switch transistor 121 and turn-off circuit 123. The specific mechanizations of the turn-off circuit 123 and the control signal circuit 124 are irrelevant to the performance of the invention. Any mechanization that performs the desired functions would be well within the purview of one skilled in the art, having the knowledge of the application herewith presented.

During the off state of the power switching transistor 111, the snubber capacitor 115 stays charged since diode 118 is reverse biased and transistor 121 is maintained off by the control signal circuit. During this period the control signal keeps the turn-off circuit 123 enabled which maintains the power switching transistor 111 in its off state.

When an external or internal turn-on control signal occurs, the control signal circuit disables the turn-off circuit 123 and provides enough base drive current to transistor 121 to cause it to saturate. When transistor 121 turns on it causes the snubber capacitor to discharge through resistors 116 and 122 into the base-emitter junction of switching power transistor 111. When the snubber capacitor charge potential drops to that of the power supply 117, diode 118 becomes forward biased and provides the remaining or steady state base drive current from supply 117. At this point no more current flows from the snubber capacitor 115 and its residual charge remains at a potential which is approximately the same as the power supply 117 potential.

When the turn-on control signal is removed the control signal circuitry 124 removes the base drive to transistor 121 and enables the turn-off circuit 123. This action disconnects resistor 116 from the discharge path and turns off transistor 111. As the switching power transistor 111 turns off, the capacitor 115 is recharged through diode 114 as would a conventional snubber. This new charge is maintained on the snubber capacitor 115 until the next subsequent turn on of the switching power transistor 111 causing the previously described sequence to be repeated.

Figure 5:
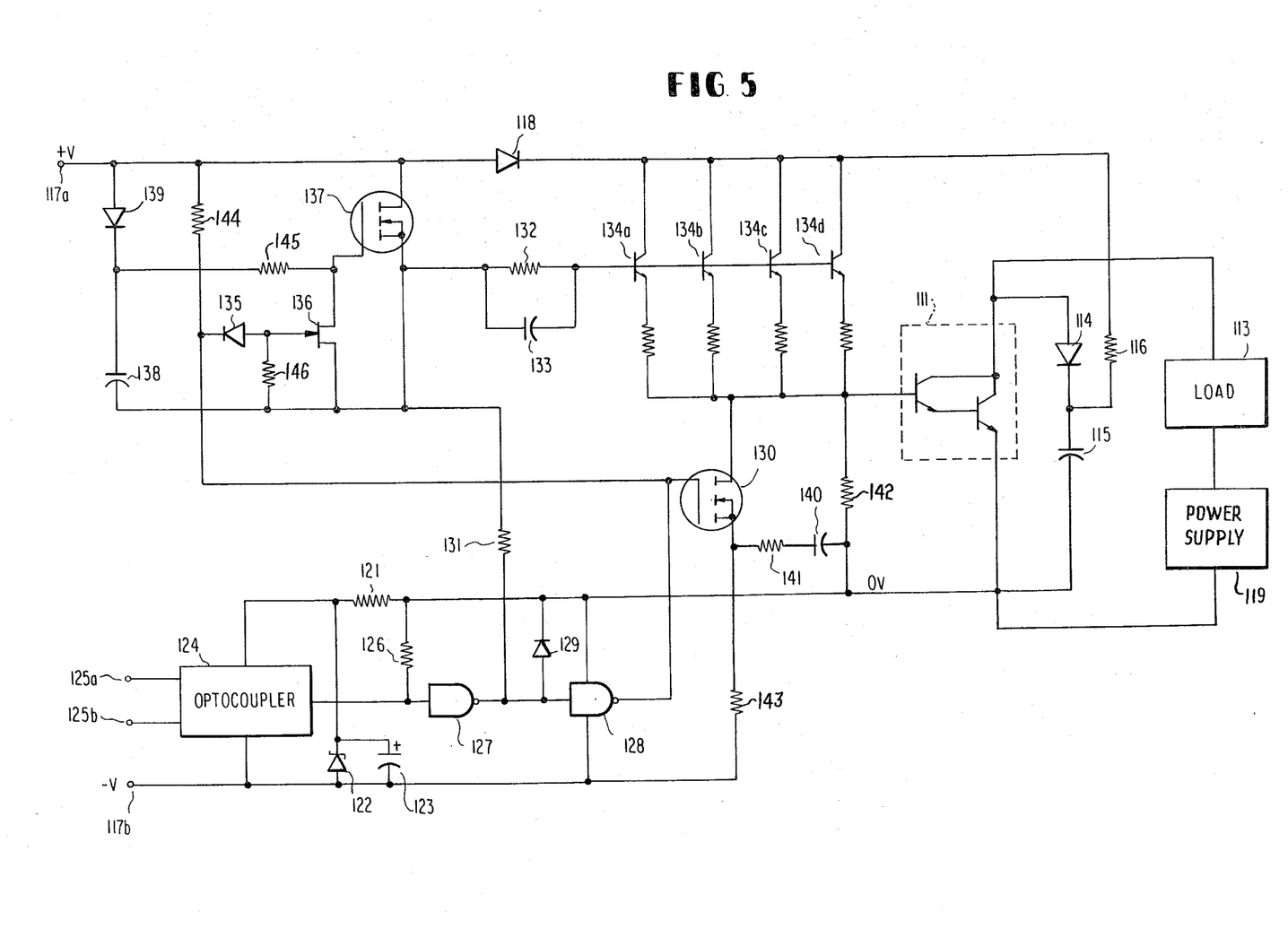
FIG. 5 is a schematic diagram illustrating a specific preferred embodiment of the invention.

FIG. 5 shows a specific preferred embodiment of the invention. The switching power transistor 111 is represented as a Darlington pair which, depending on the specific application, may comprise a plurality of paralleled output transistors driven by one or more parallel driver transistors. The snubber circuit consists of diode 114 and snubber capacitor 115 connected in series between the collector terminal and the emitter terminal of the switching power transistor 111 and resistor 116 connected at one end to the junction of diode 114 and snubber capacitor 115. The load 113 and power supply 119 is connected between the collector terminal and the emitter terminal of the switching power transistor 111.

The power supply for the base driver circuit is referenced to the emitter terminal of the switching power transistor 111 and is connected between terminals 117a and 117b. More specifically, terminal 117a has a voltage $+V$ applied to it, and terminal 117b has a voltage $-V$ applied to it. Intermediate of the voltages applied to the terminals 117a and 117b is a line connected to the emitter terminal of the switching power transistor 111 at zero volts. A voltage dropping resistor 121, a Zener diode 122 and a capacitor 123 are used to establish a stable supply voltage for an opto-coupler 124. A switching control signal of a pulse width modulated type having relatively fast rise and fall time is supplied from a source (not shown) of a type well known in the art and is applied to input terminals 125a and 125b of the opto-coupler to control the turn-on and turn-off of the switching power transistor 111. The output of the opto-coupler 124 which is referenced to the zero volt line by a resistor 126 is supplied to the input of a logic gate 127. The logic gate 127 is a power NAND buffer with open collector outputs referenced to the $-V$ terminal 117b. The output of logic gate 127 is supplied to the input of a second logic gate 128, also a NAND buffer, and the output of logic gate 127 is clamped at zero volts maximum potential by a diode 129 to protect the inputs of the second logic gate 128. An output terminal of logic gate 128 is connected to a gate terminal of a power field effect transistor (FET) 130. The FET 130 operates as a switch to control the power transistor 111. FET 130 has a drain terminal connected to the base terminal of transistor 111 and a source terminal connected through a current limiting resistor 143 to the $-V$ terminal 117b. A base current source comprising four paralleled transistor stages 134a, 134b, 134c and 134d is connected between the base terminal of transistor 111 and the +V terminal 117a. Each of the transistors 134 has an emitter terminal connected through a corresponding emitter resistor 146 to the base terminal of transistor 111. A collector terminal of each transistor 134 is connected to a common junction and thence through a reverse current blocking diode 118 to +V terminal 117a.

Turn-off time of transistor 111 is reduced by a charge-sweeping capacitor 140 serially connected with a damping resistor 141 through the drain-source terminal of FET 130 between the base terminal and emitter terminal of transistor 111. When transistor 130 is gated into conduction, the reverse charge stored on capacitor 141 forces a reverse current through the emitter-base junction of transistor 111 to rapidly force transistor 111 non-conductive. The resistor 141 may have a value of less than one ohm serves to damp oscillatory currents. A resistor 142 provides a leakage current path for the base junction of transistor 111 in the event the high voltage source 119 is energized while the low voltage base drive power source 117 is de-energized.

A gating circuit comprising a FET 137 and a FET 136 controls the base drive current supplied to base current source transistors 134. FET 137 has a drain terminal connected to +V terminal 117a and a source terminal connected through a current limit resistor 131 to the output terminal of logic gate 127. A gate terminal of FET 137 is connected through a current limiting resistor 145 to a junction intermediate a diode 139 and a capacitor 138. The diode 139 and capacitor 138 are serially connected between the drain and source terminals of FET 137 with the diode 139 being poled such that capacitor 138 can be charged from the +V terminal 117a. Drive current is coupled from the source terminal of FET 137 through a speed-up capacitor 133 and parallel connected current setting resistor 132 to a base terminal of transistors 134.

The FET 137 is controlled by the FET 136 which FET 136 is connected between the gate and source terminals of FET 137. Preferably, FET 136 is a junction FET such that its source to drain impedance is relatively low in the absence of any reverse gate bias. FET 136 is forced into non-conduction by a signal from logic gate 128 which is coupled through a diode 135 to the gate terminal of FET 136. A pull-up resistor 144 assures that diode 135 is reverse biased when the output of gate 128 becomes open-circuit.

With no control signal applied to the opto-coupler 124, the first logic gate 127 is saturated, and the second logic gate 128 is open. This allows the gate potential of the power FET 130 to be pulled up to the +V supply, turning it on. The output of the first logic gate 127 through the resistor 131 and the parallel connection of resistor 132 and capacitor 133 keeps the bases of the four parallel driver transistor stages 134a, 134b, 134c, and 134d at a negative potential and provides a leakage path for the driver stages. Moreover, the logic states of logic gates 127 and 128 maintain a reverse bias across diode 135 resulting in a zero gate bias for transistor 136. The zero gate bias maintains transistor 136 on which keeps the V-MOS driver FET 137 in the off state.

To turn the base drive on, a switching current is applied to the input terminals 125a and 125b of the opto-coupler 124. This causes the logic gate outputs to change states. The output of logic gate 128 is pulled down to the −V supply voltage which immediately turns off transistor 130 and applies a negative gate bias to transistor 136 which turns it off. When transistor 136 opens, some of the charge on capacitor 138 is dumped into the input capacitance of transistor 137 turning it on. As transistor 137 turns on, its gate is boot strapped above the supply by means of diode 139 which is reversed biased, holding it on. Capacitor 133 is a speed-up capacitor which bypasses the current setting resistor 132 to provide increased base current to the driver stages 134a, 134b, 134c and 134d at turn-on. The time constant of this speed-up circuit is set equal or slightly longer than the discharge time constant of the snubber. This improves the turn-on rise time of the switching power transistor 111 and reduces dissipation in the driver transistors 134a–d.

At turn-on, the snubber capacitor 115 is discharged via resistor 116 through the driver stages 134a, 134b, 134c, and 134d and the base-emitter junctions of the switching power transistor 111. While the snubber capacitor 115 is being discharged, the diode 118 is reverse biased. As the charge decays, the source of base current transfers from the snubber capacitor 115 to the +V supply voltage.

When the control signal to the opto-coupler 124 is removed, logic gate turns-on and logic gate 128 turns-off and as a result, transistor 130 turns on immediately. Transistor 136 also turns on which shorts the gate bias voltage of transistor 137 turning it off. The boot strap capacitor 138 then recharges to the supply through diode 139. Capacitor 133 also helps to speed up the driver stage turn-off.

Capacitor 140 connected in the source circuit of transistor 130 provides the current path during the turn-off transition. This capacitor is recharged through resistor 141 while the switching power transistor 111 is on and the transistor 130 is off.

The snubber discharge time constant must be picked so that the capacitor 115 is always discharged to the bias supply voltage before the transistor 111 is turned off again to ensure the same snubbing capability.

Figure 6A:
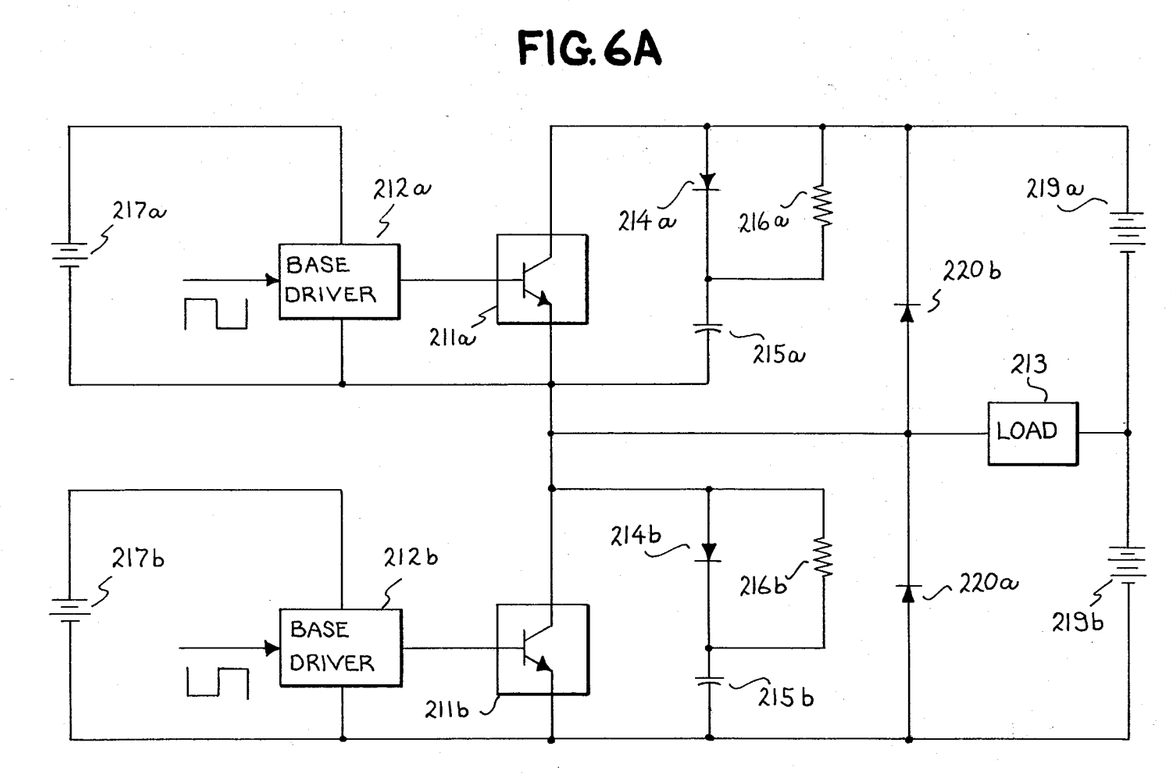
FIG. 6a is a block and schematic diagram of a simplified push-pull configuration using the prior art circuit shown in FIG. 1.
Figure 6B:
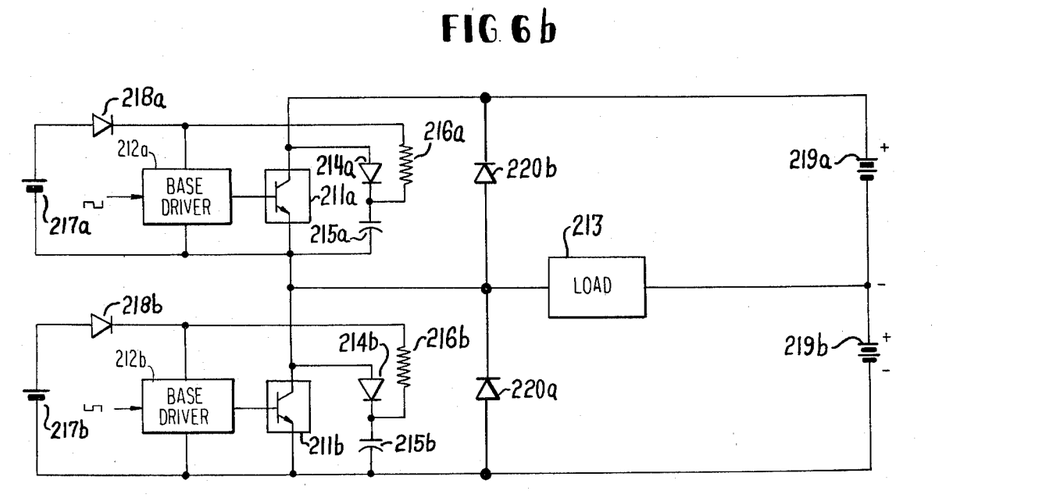
FIG. 6b is a block and schematic diagram of a simplified push-pull configuration of the circuit shown in FIG. 3.

FIGS. 6a and 6b show basic power switch circuits duplicated to form push-pull power switch. Each base driver 212a and 212b is supplied with a switching signal on alternate half cycles. It will be recognized by those skilled in the art that the configuration shown in FIGS. 6a and 6b is a half bridge, and it is possible to provide a full bridge configuration by simply replacing the supply center tap with two more power switching circuits. Such push-pull configurations are used in pulse width modulation (PWM) systems. When driving inductive loads, the load appears as a constant current source, assuming that the modulation frequency is much greater than the fundamental frequency. On a given half cycle, the load current is alternately switched between the corresponding transistor and its clamp diode path 220 while the alternate transistor and clamp diode 220 are not conducting.

In a push-pull power switch using conventional snubber circuits as represented in FIG. 6a, the alternate snubber is still connected to the load and is discharged during every PWM cycle through the discharge resistor into the load every free wheeling period. When the modulated transistor turns back on, high peak collector currents flow through the alternate snubber circuit until it regains its charge. This causes the discharge resistor to dissipate high power during both half cycles of the fundamental frequency. In addition, the high peak charging currents dictate the use of overrated snubber capacitors.

Figure 8:
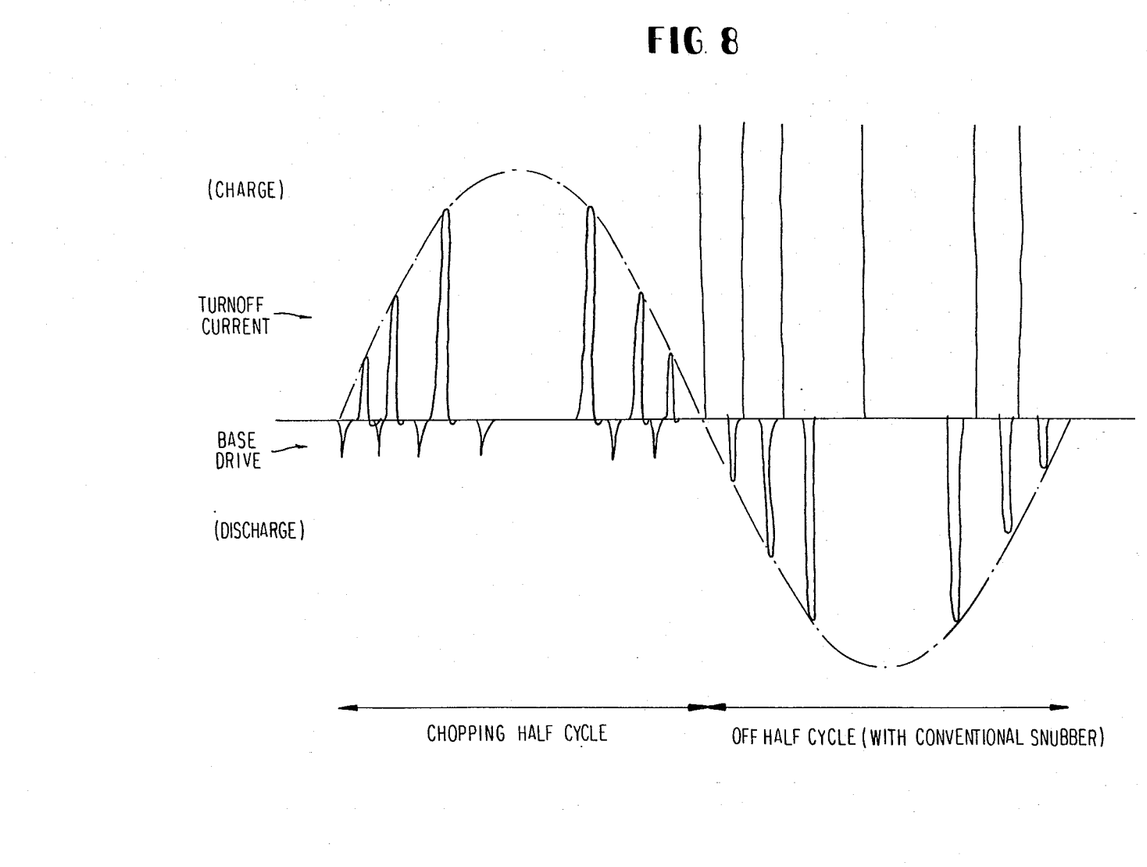
FIG. 8 is a graph showing the approximate current flowing in and out of the snubber capacitor during one cycle of the base frequency waveform for a push-pull system operating in a chopping mode of operation; and, FIG. 9 is a partial block diagram, partial schematic of a specific embodiment of the invention.

As shown in FIG. 6b, by using the improved snubber circuit according to the present invention, the snubber capacitor is automatically disconnected from the load on one half cycle, except for leakage currents through the snubber diode 214. The high peak currents are eliminated from both the alternate snubber capacitor and the modulated transistor. The snubber resistor 216 only dissipates power on one half cycle reducing its losses by fifty percent. FIG. 8 illustrates the approximate snubber capacitor current for one PWM cycle. The left half of FIG. 8 is the chopping half cycle, and the right half of FIG. 8 is the OFF half cycle. The dashed sinusoidal line represents average load current. The pulse currents during both the chopping half cycle and the off half-cycle are characteristic of conventional snubber circuits. The currents shown in the OFF half cycle are eliminated with the new snubber circuit according to the present invention. The elimination of the large positive current spikes during the OFF half cycle reduces stress on the snubber components and the switching power transistors.

Figure 7:
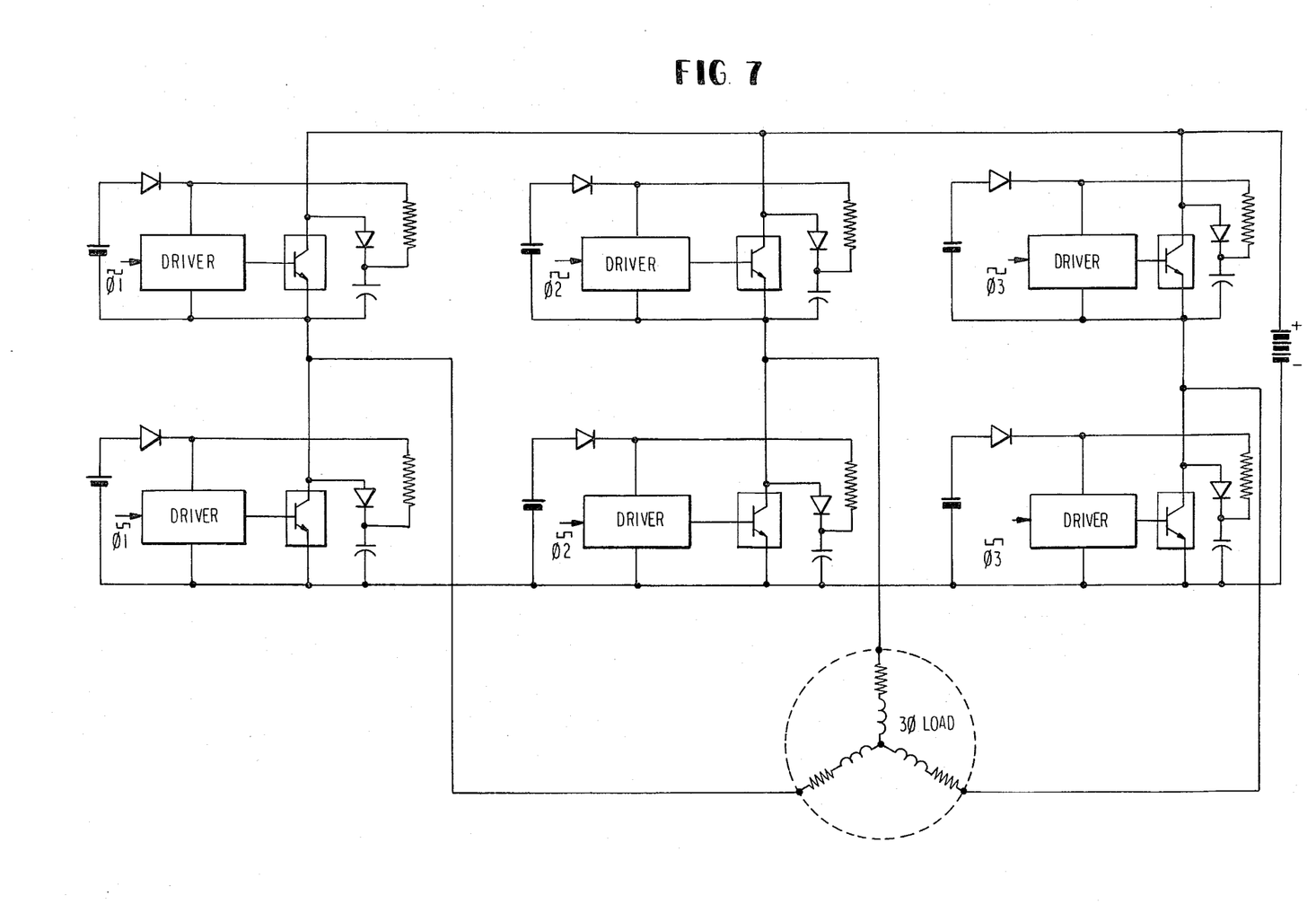
FIG. 7 is a block and schematic diagram of the push-pull configuration shown in FIG. 6b as applied to a three phase load.

The push-pull configuration of FIG. 6b can be applied to a multi-phase system, an example of which is shown in FIG. 7. More specifically, FIG. 7 shows a three phase system which could be readily expanded to n phases. This arrangement has the same advantages as the simplified push-pull arrangement shown in FIG. 6.

What is claimed is:

1. An improved snubber circuit for use in a switching transistor circuit including at least one power transistor, the transistor circuit being of the type responsive to control signals for rapidly switching the transistor between conductive and non-conductive states to alternately connect and disconnect a load and a power source, comprising:
   (a) a base drive circuit connected between a base terminal and an emitter terminal of the transistor; and
   (b) a diode, a capacitor and a resistor, said diode and said capacitor being connected in series between a collector terminal and the emitter terminal of the transistor, and said resistor being connected at one end to the junction of said diode and said capacitor and at the other end to said base drive circuit in a manner such that current flow from said capacitor through said resistor is exclusively to said base drive circuit, said resistor providing a discharge path for said capacitor to supply base boost to said power transistor when said power transistor is switched to a conductive state.

2. The snubber circuit recited in claim 1 wherein said power transistor is a plurality of transistors connected in a Darlington configuration.

3. The snubber circuit recited in claim 1 further comprising a second diode to isolate a supply voltage connected to said base drive circuit from the discharge of said capacitor.

4. A switching power transistor circuit comprising:
   (a) first and second bipolar transistors each having a base, collector and emitter, the emitter of said first bipolar transistor being connected to the collector of said second bipolar transistor;
   (b) first and second base drive circuits connected respectively between the base and the emitter of said first and second bipolar transistors, said first and second base drive circuits being responsive to a source of pulses in alternate half cycles to switch said first or second bipolar transistors on and off;
   (c) a load connected to the junction of the emitter of said first bipolar transistor and the collector of said second bipolar transistor;
   (d) first and second snubbers for said first and second bipolar transistors, each of said first and second snubbers consisting of a diode, a capacitor and a resistor, said diode and said capacitor being connected in series between the collector and the emitter of the corresponding bipolar transistor, and said resistor being connected at one end to the junction of said diode and said capacitor; and
   (e) first and second means for connecting the other end of the resistor in each of said first and second snubbers respectively to said first and second base turn-on circuits in a manner such that current flow from the corresponding capacitor through the resistor is exclusively to the corresponding one of said first and second base drive circuits, said resistor in said first and second snubbers providing a discharge path for said capacitor to supply base boost to the corresponding one of said first and second bipolar transistors when that transistor is switched on.

5. An improved snubber circuit for use in a switching transistor circuit including at least one power transistor, the transistor circuit being of the type responsive to control signals for rapidly switching the transistor between conductive and non-conductive states to alternately connect and disconnect a load and a power source, comprising:
   (a) a base drive circuit connected between a base terminal and an emitter terminal of the transistor;
   (b) a diode, a capacitor and a resistor, said diode and said capacitor being connected in series between a collector terminal and the emitter terminal of the transistor, and said resistor being connected at one end to the junction of said diode and said capacitor;
   (c) means for connecting the other end of said resistor to said base drive circuit, said resistor providing a discharge path for said capacitor to supply base boost to said power transistor when said power transistor is switched to a conductive state; and
   (d) a second diode to isolate a supply voltage connected to said base drive circuit from the discharge of said capacitor.

* * * * *